US012772911B2

(12) United States Patent
Shibata et al.

(10) Patent No.: US 12,772,911 B2
(45) Date of Patent: Oct. 20, 2026

(54) SEMICONDUCTOR DEVICE MANUFACTURING METHOD, SEMICONDUCTOR DEVICE, INTEGRATED CIRCUIT ELEMENT, AND INTEGRATED CIRCUIT ELEMENT MANUFACTURING METHOD

(71) Applicant: Resonac Corporation, Tokyo (JP)

(72) Inventors: Tomoaki Shibata, Tokyo (JP); Shizu Fukuzumi, Tokyo (JP); Toshiaki Shirasaka, Tokyo (JP)

( * ) Notice: Subject to any disclaimer, the term of this patent is extended or adjusted under 35 U.S.C. 154(b) by 469 days.

(21) Appl. No.: 18/552,220

(22) PCT Filed: Mar. 24, 2022

(86) PCT No.: PCT/JP2022/014146
§ 371 (c)(1),
(2) Date: Sep. 25, 2023

(87) PCT Pub. No.: WO2022/203020
PCT Pub. Date: Sep. 29, 2022

(65) Prior Publication Data

US 2024/0170447 A1 May 23, 2024

(30) Foreign Application Priority Data

Mar. 26, 2021 (WO) .................. PCT/JP2021/012899

(51) Int. Cl.
*H10W 90/00* (2026.01)
*H10W 80/00* (2026.01)

(52) U.S. Cl.
CPC .......... *H10W 90/00* (2026.01); *H10W 80/033* (2026.01); *H10W 80/312* (2026.01);
(Continued)

(58) Field of Classification Search
CPC . H10W 90/00; H10W 80/033; H10W 80/312; H10W 80/327; H10W 80/754;
(Continued)

(56) References Cited

U.S. PATENT DOCUMENTS 4,612,083 A * 9/1986 Yasumoto ............. H10P 10/128 257/E21.515
2013/0009321 A1* 1/2013 Kagawa .............. H10W 20/084 438/455
(Continued)

FOREIGN PATENT DOCUMENTS

JP S61-030059 2/1986
JP 2008-501239 1/2008
(Continued)

OTHER PUBLICATIONS

International Search Report dated Jun. 29, 2021 for PCT/JP2021/012899.
(Continued)

*Primary Examiner* — Julia Slutsker
(74) *Attorney, Agent, or Firm* — SHIPWAY IP

(57) ABSTRACT

A method for manufacturing a semiconductor device includes providing a first integrated circuit element including a first semiconductor substrate, a first insulating film, and a first electrode, providing a second integrated circuit element including a second semiconductor substrate, a second insulating film, and a second electrode, bonding the first insulating film and the second insulating film to each other, and bonding the first electrode and the second electrode to each other. The first insulating film includes a first inorganic insulating layer and a first organic insulating layer. The second insulating film includes a second inorganic insulating layer and a second organic insulating layer. The thickness of the first organic insulating layer is smaller than the thickness of the first inorganic insulating layer, and the thickness of the second organic insulating layer is smaller than the thickness of the second inorganic insulating layer.

18 Claims, 5 Drawing Sheets

(52) U.S. Cl.
CPC ........ *H10W 80/327* (2026.01); *H10W 80/754* (2026.01); *H10W 90/792* (2026.01)

(58) Field of Classification Search
CPC ... H10W 90/792; H10W 20/01; H10W 20/40; H10W 80/00; H10W 20/43; H10W 20/48; H10W 72/90; H10W 72/01; H10W 72/01951; H10D 99/00; H10P 14/40; H10P 95/00
See application file for complete search history.

(56) References Cited

U.S. PATENT DOCUMENTS

| | | | | |
|---|---|---|---|---|
| 2019/0157333 | A1 | 5/2019 | Tsai | |
| 2021/0391292 | A1* | 12/2021 | Kayaba | C09J 5/06 |

FOREIGN PATENT DOCUMENTS

| | | |
|---|---|---|
| JP | 2012-069585 | 4/2012 |
| JP | 2013-033786 | 2/2013 |
| KR | 20140107129 | 9/2014 |
| TW | 201403775 | 1/2014 |
| WO | 2020/085183 | 4/2020 |

OTHER PUBLICATIONS

International Search Report dated Jun. 28, 2022 for PCT/JP2022/014146.

International Preliminary Report on Patentability with Written Opinion dated Oct. 5, 2023 for PCT/JP2021/012899.

International Preliminary Report on Patentability with Written Opinion dated Oct. 5, 2023 for PCT/JP2022/014146.

* cited by examiner

SEMICONDUCTOR DEVICE MANUFACTURING METHOD, SEMICONDUCTOR DEVICE, INTEGRATED CIRCUIT ELEMENT, AND INTEGRATED CIRCUIT ELEMENT MANUFACTURING METHOD

CROSS-REFERENCE TO RELATED APPLICATIONS

This application is a 35 U.S.C. § 371 national phase application of PCT/JP2022/014146, filed on Mar. 24, 2022, which claims priority to International Patent Application No. PCT/JP2021/012899, filed on Mar. 26, 2021.

TECHNICAL FIELD

The present disclosure relates to a method for manufacturing a semiconductor device, a semiconductor device, an integrated circuit element, and a method for manufacturing an integrated circuit element.

BACKGROUND ART

Patent Literature 1 discloses a hybrid bonding method, which is a three-dimensional integration technique for semiconductors. In this bonding method, an insulating film is formed around electrodes on each bonding surface of a pair of integrated circuit elements (for example, a pair of semiconductor wafers), and the electrodes are bonded to each other and the insulating films are bonded to each other. A similar technique is disclosed in Patent Literature 2.

CITATION LIST

Patent Literature

Patent Literature 1: Specification of U.S. Patent Application Publication No. 2019/0157333

Patent Literature 2: Japanese Unexamined Patent Publication No. 2012-069585

SUMMARY OF INVENTION

Technical Problem

In the bonding method described in Patent Literature 1, copper (Cu) is used as an electrode of the integrated circuit element, and an inorganic insulating film such as silicon dioxide ($SiO_2$) is used as an insulating film. When bonding such integrated circuit elements to each other, it is required to process the surfaces of the electrodes and the surface of the insulating film, which serve as bonding surfaces, with accurate flatness, generally at the level of several nanometers. However, it may be difficult to achieve this. If foreign matter enters between the integrated circuit elements when bonding the integrated circuit elements to each other, the foreign matter cannot be embedded in the insulating film because the inorganic insulating film is a hard material. For this reason, bonding between the insulating films may be adversely affected. Since the inorganic insulating film is a hard material, cracks may occur on the bonding surfaces of the integrated circuit elements due to stress strain after bonding. On the other hand, when an organic material is used for the insulating film as in the bonding method described in Patent Literature 2, defective bonding may occur due to outgassing from the organic material.

It is an object of the present disclosure to provide a method for manufacturing a semiconductor device, a semiconductor device, an integrated circuit element, and a method for manufacturing an integrated circuit element that allow integrated circuit elements to be more easily and reliably bonded to each other.

Solution to Problem

One aspect of the present disclosure relates to a method for manufacturing a semiconductor device. The method for manufacturing a semiconductor device includes providing a first integrated circuit element including a first semiconductor substrate having a semiconductor element and a first wiring layer having a first insulating film and a first electrode, the first wiring layer being provided on a surface of the first semiconductor substrate; providing a second integrated circuit element including a second semiconductor substrate having a semiconductor element and a second wiring layer having a second insulating film and a second electrode, the second wiring layer being provided on a surface of the second semiconductor substrate; bonding the first insulating film of the first integrated circuit element and the second insulating film of the second integrated circuit element to each other; and bonding the first electrode of the first integrated circuit element and the second electrode of the second integrated circuit element to each other. The first insulating film includes a first inorganic insulating layer containing an inorganic insulating material and a first organic insulating layer containing an organic insulating material. The first organic insulating layer is located on a first bonding surface side of the first integrated circuit element opposite to the first semiconductor substrate. The second insulating film includes a second inorganic insulating layer containing an inorganic insulating material and a second organic insulating layer containing an organic insulating material. The second organic insulating layer is located on a second bonding surface side of the second integrated circuit element opposite to the second semiconductor substrate. A thickness of the first organic insulating layer is smaller than a thickness of the first inorganic insulating layer, and a thickness of the second organic insulating layer is smaller than a thickness of the second inorganic insulating layer.

In this manufacturing method, the organic insulating layer is arranged on the bonding surface side of each of the first integrated circuit element and the second integrated circuit element, and the inorganic insulating layer is provided inside each of the first integrated circuit element and the second integrated circuit element. In this case, an organic insulating material, for which it is easy to perform processing such as flattening and which is soft, is provided on each bonding surface side, while an inorganic insulating material, with which fine wiring can be formed and which is excellent in heat resistance reliability, is provided inside each of the first integrated circuit element and the second integrated circuit element. Therefore, it is possible to more easily and reliably bond integrated circuit elements having fine wiring to each other. In addition, since the organic insulating material is easily pressure-bonded by heating, the accuracy of the flatness of the surface of the electrode and the surface of the insulating film, which serve as bonding surfaces, can be relaxed. Further, according to this manufacturing method, since the organic insulating layer needs to be used only on at least the bonding surfaces of the first integrated circuit element and the second integrated circuit element, the amount of the organic insulating layer used can be reduced.

Therefore, it is possible to suppress the occurrence of outgassing in a vacuum process or a heating process. Further, in this manufacturing method, the thickness of the first organic insulating layer is smaller than the thickness of the first inorganic insulating layer, and the thickness of the second organic insulating layer is smaller than the thickness of the second inorganic insulating layer. Therefore, it is possible to increase the amount of the inorganic insulating layer, in which fine wiring can be formed and which is excellent in heat resistance reliability, while using a small amount of organic insulating layers having excellent workability on each bonding surface side. As a result, it is possible to more easily and reliably bond the integrated circuit elements having fine wiring to each other. In addition, by making the first organic insulating layer and the second organic insulating layer thin, it is possible to suppress the occurrence of outgassing in a vacuum process or a heating process.

In the manufacturing method described above, it is preferable that the organic insulating material contained in at least one of the first organic insulating layer and the second organic insulating layer has a Young's modulus of 7.0 GPa or less. Therefore, even if foreign matter enters between the integrated circuit elements, the foreign matter can be embedded in one of the organic insulating layers. As a result, it is possible to prevent bonding between the insulating films from being adversely affected by the foreign matter. More preferably, the organic insulating material contained in at least one of the first organic insulating layer and the second organic insulating layer has a Young's modulus of 3.0 GPa or less. In this case, since the foreign matter entering between the integrated circuit elements can be more reliably embedded in the organic insulating layer, it is possible to more reliably bond the integrated circuit elements to each other.

In the manufacturing method described above, the organic insulating material contained in at least one of the first organic insulating layer and the second organic insulating layer may contain polyimide, a polyimide precursor, polyamideimide, benzocyclobutene (BCB), polybenzoxazole (PBO), or a PBO precursor. In this case, it is possible to further improve the connection reliability at a bonding portion using the organic insulating material.

In the manufacturing method described above, the first inorganic insulating layer may be formed as a plurality of layers, and the first organic insulating layer may be formed as a single layer. In this case, it is possible to increase the amount of the first inorganic insulating layer, in which fine wiring can be formed and which is excellent in heat resistance reliability, while using a small amount of organic insulating layers having excellent workability. As a result, it is possible to more easily and reliably bond the integrated circuit elements having fine wiring to each other. The second inorganic insulating layer may be formed as a plurality of layers, and the second organic insulating layer may be formed as a single layer. Even in this case, the same effects as those described above can be obtained.

In the manufacturing method described above, at least one of the first organic insulating layer and the second organic insulating layer may have a thickness of 10 μm or less. In this case, since the amount of the organic insulating layer used can be reduced, it is possible to suppress the occurrence of outgassing in a vacuum process or a heating process.

The manufacturing method described above may further include polishing the first organic insulating layer and the first electrode of the first integrated circuit element; and polishing the second organic insulating layer and the second electrode of the second integrated circuit element. Therefore, the first integrated circuit element and the second integrated circuit element can be more reliably bonded to each other. In the above case, in the polishing of the first integrated circuit element, the first organic insulating layer and the first electrode may be polished by using a chemical mechanical polishing method so that a surface of the first organic insulating layer has the same height as a surface of the first electrode or the surface of the first organic insulating layer is recessed from the first electrode considering the thermal expansion due to heating during bonding (specifically, the organic insulating layer material has a larger thermal expansion than the metal material used as the electrode). In the polishing of the second integrated circuit element, the second organic insulating layer and the second electrode may be polished by using a chemical mechanical polishing method so that a surface of the second organic insulating layer has the same height as a surface of the second electrode or is recessed from the second electrode. In the above case, in the polishing of the first integrated circuit element, polishing may be performed so that a surface roughness Ra of the surface of the first organic insulating layer is 2 nm or less. In the polishing of the second integrated circuit element, polishing may be performed so that a surface roughness Ra of the surface of the second organic insulating layer is 2 nm or less. In this case, the first integrated circuit element and the second integrated circuit element can be more strongly bonded to each other. The surface roughness Ra used herein is the arithmetic mean roughness (Ra) specified in JIS B 0601-2001.

Another aspect of the present disclosure relates to a semiconductor device. This semiconductor device includes a first integrated circuit element and a second integrated circuit element. The first integrated circuit element includes a first semiconductor substrate having a semiconductor element and a first wiring layer having a first insulating film and a first electrode and provided on a surface of the first semiconductor substrate. The second integrated circuit element includes a second semiconductor substrate having a semiconductor element and a second wiring layer having a second insulating film and a second electrode and provided on a surface of the second semiconductor substrate, and is bonded to the first integrated circuit element. The first insulating film has a first inorganic insulating layer containing an inorganic insulating material and a first organic insulating layer containing an organic insulating material, and the first organic insulating layer is located on a first bonding surface side of the first integrated circuit element opposite to the first semiconductor substrate. The second insulating film has a second inorganic insulating layer containing an inorganic insulating material and a second organic insulating layer containing an organic insulating material, and the second organic insulating layer is located on a second bonding surface side of the second integrated circuit element opposite to the second semiconductor substrate. In this semiconductor device, the first organic insulating layer and the second organic insulating layer are bonded to each other, and the first electrode and the second electrode are bonded to each other. A thickness of the first organic insulating layer is smaller than a thickness of the first inorganic insulating layer, and a thickness of the second organic insulating layer is smaller than a thickness of the second inorganic insulating layer.

According to the semiconductor device described above, an organic insulating material, for which it is easy to perform processing such as flattening and which is soft, is provided on the bonding surface side, and an inorganic insulating material, with which fine wiring can be formed and which is excellent in heat resistance reliability, is provided inside each integrated circuit element. The thickness of the first organic insulating layer and the thickness of the second organic insulating layer are smaller than the thickness of the inorganic insulating layer. Therefore, it is possible to obtain a semiconductor device in which integrated circuit elements having fine wiring are more easily and reliably bonded to each other.

According to still another aspect of the present disclosure, there is provided an integrated circuit element to be bonded to another integrated circuit element to manufacture a semiconductor device. The integrated circuit element includes a semiconductor substrate having a first surface and a second surface, a semiconductor element being formed at least on the first surface or inside the semiconductor substrate; and a wiring layer provided on the second surface of the semiconductor substrate. The wiring layer includes an inorganic insulating layer provided on the second surface of the semiconductor substrate; an organic insulating layer provided on the inorganic insulating layer and exposed to outside of the wiring layer; and an electrode electrically connected to the semiconductor element of the semiconductor substrate and passing through the inorganic insulating layer and the organic insulating layer to be exposed to outside from the organic insulating layer. In this integrated circuit element, a thickness of the organic insulating layer is smaller than a thickness of the inorganic insulating layer, and an organic insulating material contained in the organic insulating layer has a Young's modulus of 7.0 GPa or less.

According to this integrated circuit element, an organic insulating material, for which it is easy to perform processing such as flattening and which is soft, is provided on the bonding surface side, and an inorganic insulating material, with which fine wiring can be formed and which is excellent in heat resistance reliability, is provided inside each integrated circuit element. Therefore, when forming a semiconductor device by bonding integrated circuit elements to each other, it is possible to obtain a semiconductor device in which the integrated circuit elements are more easily and reliably bonded to each other.

According to still another aspect of the present disclosure, there is provided a method for manufacturing an integrated circuit element to be bonded to another integrated circuit element to manufacture a semiconductor device. The method for manufacturing an integrated circuit element includes providing a semiconductor substrate having a first surface and a second surface, a semiconductor element being formed at least on the first surface or inside the semiconductor substrate; and forming a wiring layer on the second surface of the semiconductor substrate. The forming of the wiring layer includes forming an inorganic insulating layer on the second surface of the semiconductor substrate; forming an inner layer electrode passing through the inorganic insulating layer so as to be electrically connected to the semiconductor element; forming an organic insulating layer on the inorganic insulating layer; and forming an outer layer electrode passing through the organic insulating layer so as to be electrically connected to the inner layer electrode. In this manufacturing method, a thickness of the organic insulating layer is smaller than a thickness of the inorganic insulating layer, and an organic insulating material contained in the organic insulating layer has a Young's modulus of 7.0 GPa or less.

According to this method for manufacturing an integrated circuit element, an organic insulating material, for which it is easy to perform processing such as flattening and which is soft, is provided on the bonding surface side, and an inorganic insulating material, with which fine wiring can be formed and which is excellent in heat resistance reliability, is provided inside each integrated circuit element. Therefore, when forming a semiconductor device by bonding integrated circuit elements to each other, it is possible to obtain a semiconductor device in which the integrated circuit elements are more easily and reliably bonded to each other.

In the above method for manufacturing an integrated circuit element, the organic insulating layer may be formed after forming the outer layer electrode. In this case, since the organic insulating layer can be formed by spin coating or the like after the outer layer electrode is formed, it is possible to easily manufacture the integrated circuit element.

Advantageous Effects of Invention

According to one aspect of the present disclosure, it is possible to manufacture a semiconductor device by bonding integrated circuit elements to each other more easily and reliably.

DESCRIPTION OF EMBODIMENTS

Figure 1:
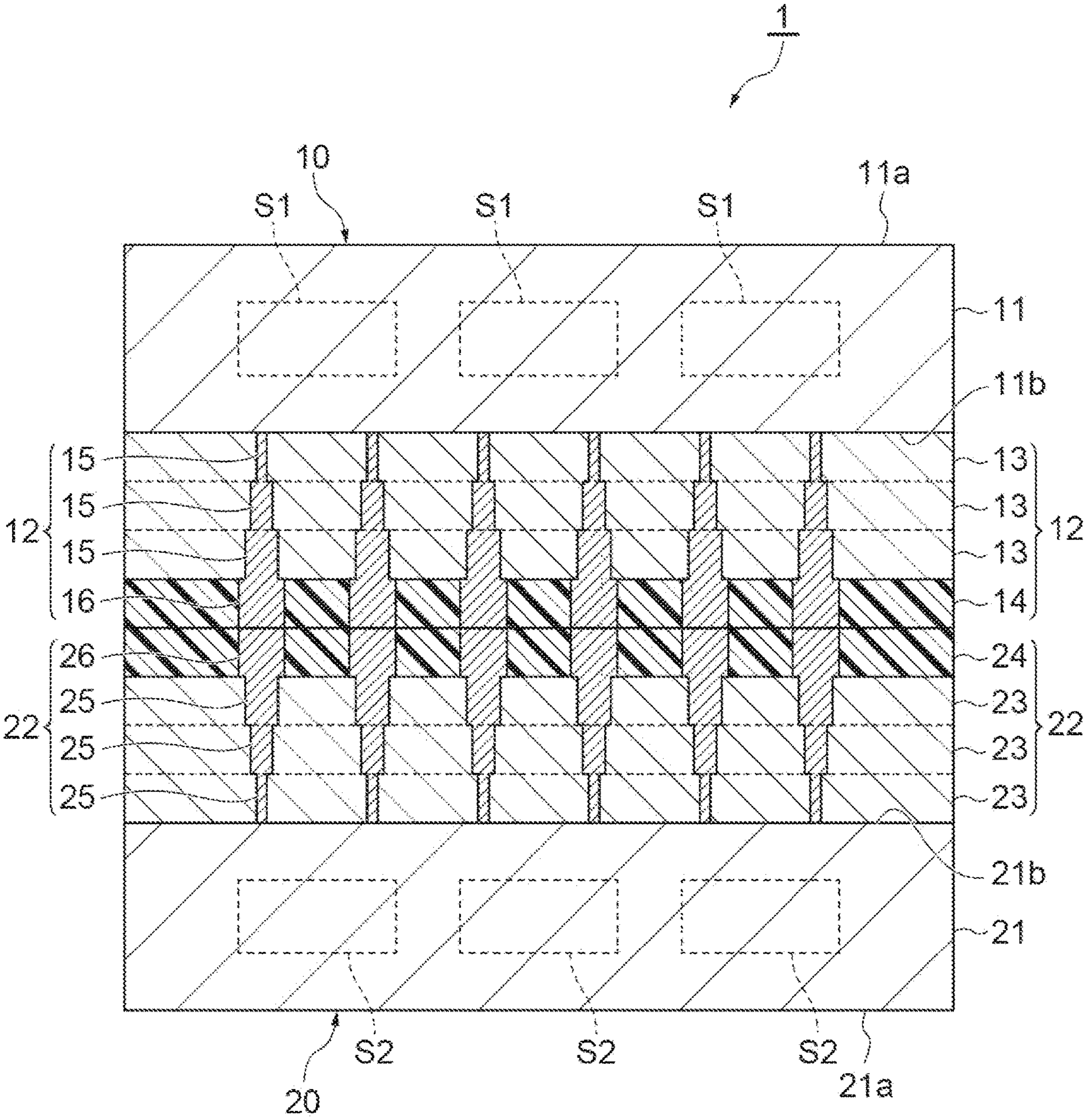
FIG. 1 is a cross-sectional view showing an example of a semiconductor device manufactured by using a method according to an embodiment of the present disclosure.

Hereinafter, several embodiments of the present disclosure will be described in detail with reference to the diagrams as necessary. In the following description, the same or equivalent portions are denoted by the same reference numerals, and repeated descriptions thereof will be omitted. It is assumed that the positional relationship such as up, down, left, and right is based on the positional relationship shown in the diagrams unless otherwise specified. When terms such as "left", "right", "front", "rear", "top", "bottom", "upper", and "lower" are used in the description and claims of this specification, these are intended to be illustrative and do not necessarily mean that these are in the relative position at all times. The dimensional ratio of each diagram is not limited to the ratio shown in the diagram.

In this specification, the term "layer" includes not only a structure having a shape formed on the entire surface but also a structure having a shape partially formed when observed as a plan view. In this specification, the term "step" includes not only an independent step but also a step whose intended action is achieved even if the step cannot be clearly distinguished from other steps. The numerical range indicated by using "to" indicates a range including the numerical values before and after "to" as the minimum and maximum values, respectively.

(Structure of Semiconductor Device)

FIG. 1 is a cross-sectional view schematically showing an example of a semiconductor device manufactured by using a manufacturing method according to the present embodiment. As shown in FIG. 1, a semiconductor device 1 includes a first integrated circuit element 10 and a second integrated circuit element 20. The first integrated circuit element 10 includes a first semiconductor substrate 11 and a first wiring layer 12 provided on the first semiconductor substrate 11. The second integrated circuit element 20 includes a second semiconductor substrate 21 and a second wiring layer 22 provided on the second semiconductor substrate 21. In the semiconductor device 1, the first wiring layer 12 of the first integrated circuit element 10 and the second wiring layer 22 of the second integrated circuit element 20 are bonded to each other through a bonding surface 10*a* (first bonding surface) and a bonding surface 20*a* (second bonding surface) (see FIG. 4). In this manner, a semiconductor device is formed. In the example shown in FIG. 1, the first integrated circuit element 10 and the second integrated circuit element 20 have the same configuration. However, the configuration of each integrated circuit element can be changed as appropriate, and the first integrated circuit element 10 and the second integrated circuit element 20 may have different configurations.

The first semiconductor substrate 11 and the second semiconductor substrate 21 are semiconductor wafers in which a plurality of semiconductor elements S1 and S2 forming a plurality of functional circuits corresponding to semiconductor chips, such as Large Scale Integrated Circuit (LSI) chips or Complementary Metal Oxide Semiconductor (CMOS) sensors, are provided. The first semiconductor substrate 11 has a first surface 11*a* and a second surface 11*b* on the opposite side, and is configured such that the plurality of semiconductor elements S1 described above are provided on the first surface 11*a*, on the second surface 11*b*, or inside the substrate. The second semiconductor substrate 21 has a first surface 21*a* and a second surface 21*b* on the opposite side, and is configured such that the plurality of semiconductor elements S2 described above are provided on the first surface 21*a*, on the second surface 21*b*, or inside the substrate.

The first wiring layer 12 and the second wiring layer 22 are layers in which a plurality of electrodes electrically connected to the plurality of semiconductor elements S1 and S2 included in the first semiconductor substrate 11 and the second semiconductor substrate 21 adjacent to each other are provided in insulating films and from which one end of each electrode is exposed to the outside. The first wiring layer 12 includes an inorganic insulating layer 13 (first inorganic insulating layer), an organic insulating layer 14 (first organic insulating layer), inner layer electrodes 15, and outer layer electrodes 16. In the first wiring layer 12, the inorganic insulating layer 13 and the organic insulating layer 14 form an insulating film (first insulating film), and the inner layer electrodes 15 and the outer layer electrodes 16 form electrodes (first electrode) wired in the insulating film. Similarly to the first wiring layer 12, the second wiring layer 22 includes an inorganic insulating layer 23 (second inorganic insulating layer), an organic insulating layer 24 (second organic insulating layer), inner layer electrodes 25, and outer layer electrodes 26. In the second wiring layer 22, the inorganic insulating layer 23 and the organic insulating layer 24 form an insulating film (second insulating film), and the inner layer electrodes 25 and the outer layer electrodes 26 form electrodes (second electrode) wired in the insulating film. In the semiconductor device 1, the organic insulating layer 14 of the first wiring layer 12 and the organic insulating layer 24 of the second wiring layer 22 are bonded to each other, and the outer layer electrodes 16 of the first wiring layer 12 and the outer layer electrodes 26 of the second wiring layer 22 are bonded to each other.

The inorganic insulating layer 13 is an insulating layer provided on/above the second surface 11*b* of the first semiconductor substrate 11. The inorganic insulating layer 13 is formed of an inorganic material, such as silicon dioxide ($SiO_2$), silicon nitride (SiN), or silicon oxynitride (SiON). The inorganic insulating layer 13 may include a plurality of insulating layers (three insulating layers as an example in the present embodiment).

The organic insulating layer 14 is a layer provided on the inorganic insulating layer 13 and exposed to the outside of the first wiring layer 12. In other words, the organic insulating layer 14 is arranged as the outermost layer in the first wiring layer 12, and one surface of the organic insulating layer 14 forms a main portion of the bonding surface 10*a*. The organic insulating layer 14 is formed of an organic material containing polyimide, a polyimide precursor, polyamideimide, benzocyclobutene (BCB), polybenzoxazole (PBO), or a PBO precursor. The organic insulating layer 14 is formed of such an organic material, has a lower elastic modulus (Young's modulus) than the inorganic insulating layer 13, and is formed of a soft material. In the semiconductor device 1, the organic insulating layer 14 is bonded to the organic insulating layer 24 of the second integrated circuit element 20. In the present embodiment, the organic insulating layer 14 is formed as, for example, a single layer, and the thickness of the organic insulating layer 14 is smaller than the total thickness of the inorganic insulating layer/layers 13. The thickness of the organic insulating layer 14 may be, for example, 1 μm or more and 10 μm or less. The thickness of the organic insulating layer 14 may be 8 μm or less, preferably 5 μm or less.

The inner layer electrodes 15 is an electrode that is electrically connected to the semiconductor element S1 of the first semiconductor substrate 11 and passes through the inorganic insulating layer 13. Each inner layer electrode 15 is formed of, for example, a conductive metal such as copper (Cu), and passes through each inorganic insulating layer 13. The inner layer electrodes 15 may be configured such that its diameter increases stepwise from the first semiconductor substrate 11 toward the organic insulating layer 14. The diameter of each inner layer electrode 15 may be, for example, 0.005 μm or more and 20 μm or less.

The outer layer electrode 16 is an electrode that is electrically connected to the inner layer electrode 15 and passes through the organic insulating layer 14 to be exposed to the outside (toward the second integrated circuit element 20 side) from the organic insulating layer 14. Each outer layer electrode 16 is formed of a conductive metal such as copper (Cu), which is the same material as the inner layer electrode 15, and passes through the organic insulating layer 14. In the semiconductor device 1, each outer layer electrode 16 is bonded to each outer layer electrode 26 of the second integrated circuit element 20. The diameter of each outer layer electrode 16 may be, for example, 0.1 μm or more and 20 μm or less.

The inorganic insulating layer 23 is an insulating layer provided on/above the second surface 21*b* of the second semiconductor substrate 21. Similarly to the inorganic insulating layer 13, the inorganic insulating layer 23 is formed of an inorganic material, such as silicon dioxide ($SiO_2$), silicon nitride (SiN), or silicon oxynitride (SiON). The inorganic insulating layer 23 may include a plurality of insulating layers (three insulating layers as an example in the present embodiment).

The organic insulating layer 24 is a layer provided on the inorganic insulating layer 23 and exposed to the outside of the second wiring layer 22. In other words, the organic insulating layer 24 is arranged as the outermost layer in the second wiring layer 22, and one surface of the organic insulating layer 24 forms a main portion of the bonding surface 20*a*. Similarly to the organic insulating layer 14, the organic insulating layer 24 is formed of an organic material containing polyimide, a polyimide precursor, polyamideimide, benzocyclobutene (BCB), polybenzoxazole (PBO), or a PBO precursor. The organic insulating layer 24 is formed of such an organic material, has a lower elastic modulus (Young's modulus) than the inorganic insulating layer 23, and is formed of a soft material. In the semiconductor device 1, the organic insulating layer 24 is bonded to the organic insulating layer 14 of the first integrated circuit element 10. The thickness of the organic insulating layer 24 may be, for example, 1 μm or more and 10 μm or less. The thickness of the organic insulating layer 24 may be 8 μm or less, preferably 5 μm or less.

The inner layer electrode 25 is an electrode that is electrically connected to the semiconductor element S2 of the second semiconductor substrate 21 and passes through the inorganic insulating layer 23. Similarly to the inner layer electrode 15, each inner layer electrode 25 is formed of, for example, a conductive metal such as copper (Cu), and passes through each inorganic insulating layer 23.

The outer layer electrode 26 is an electrode that is electrically connected to the inner layer electrode 25 and passes through the organic insulating layer 24 to be exposed to the outside from the organic insulating layer 24. Each outer layer electrode 26 is formed of a conductive metal such as copper (Cu), which is the same material as the inner layer electrode 25, and passes through the organic insulating layer 24. In the semiconductor device 1, each outer layer electrode 26 is bonded to each outer layer electrode 16 of the first integrated circuit element 10.

(Method for Manufacturing Semiconductor Device)

Figure 2A:
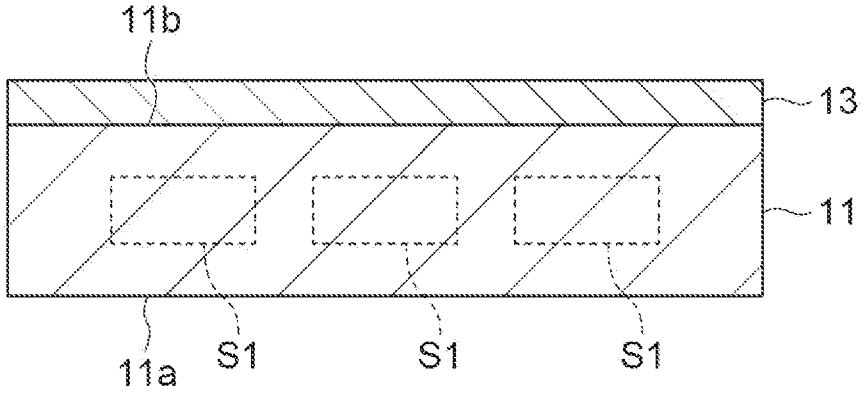
FIGS. 2A to 2C are cross-sectional views showing a part of a method for manufacturing an integrated circuit element used in manufacturing the semiconductor device shown in FIG. 1.
Figure 2B:
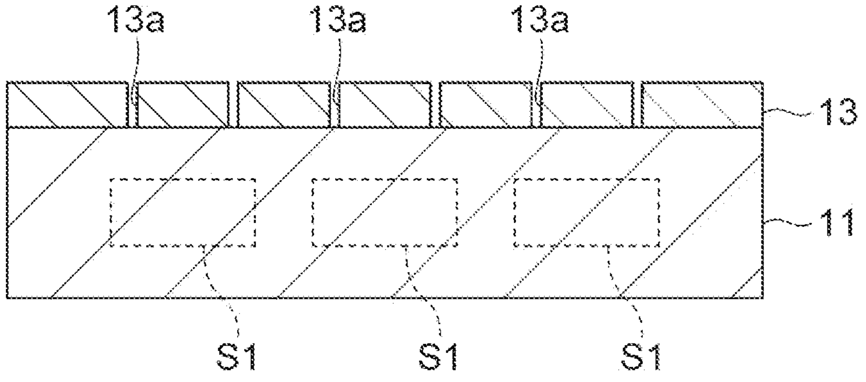
Figure 2C:
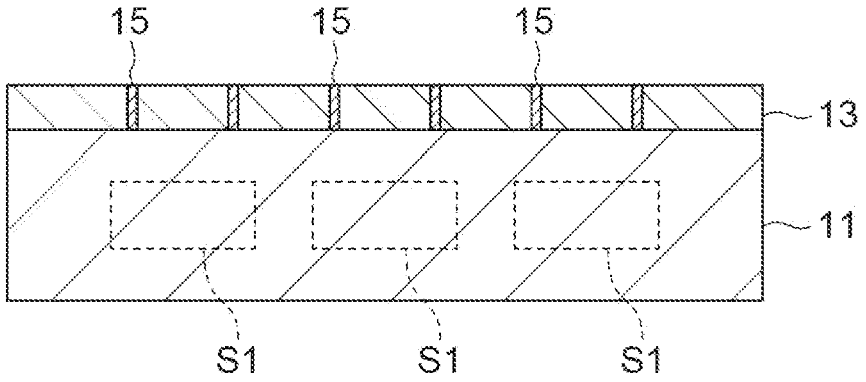
Figure 3A:
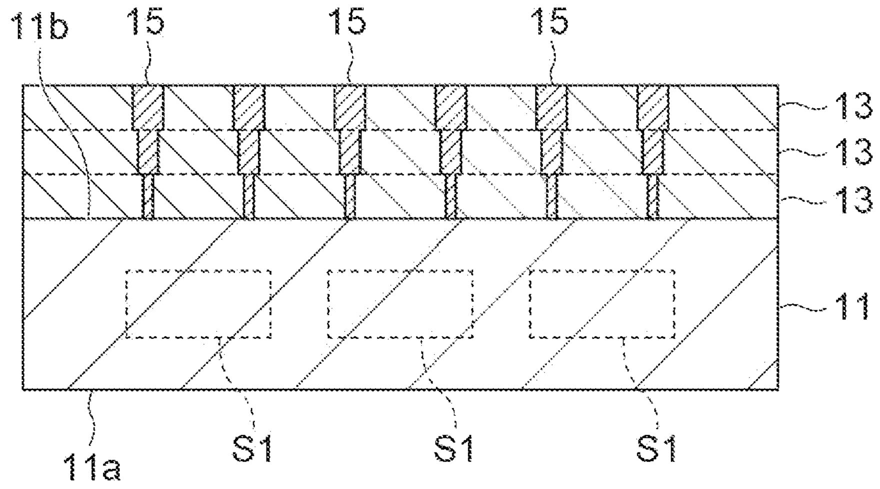
FIGS. 3A to 3C are cross-sectional views showing steps of the method for manufacturing an integrated circuit element, which are performed subsequent to the steps in FIGS. 2A to 2C.
Figure 3B:
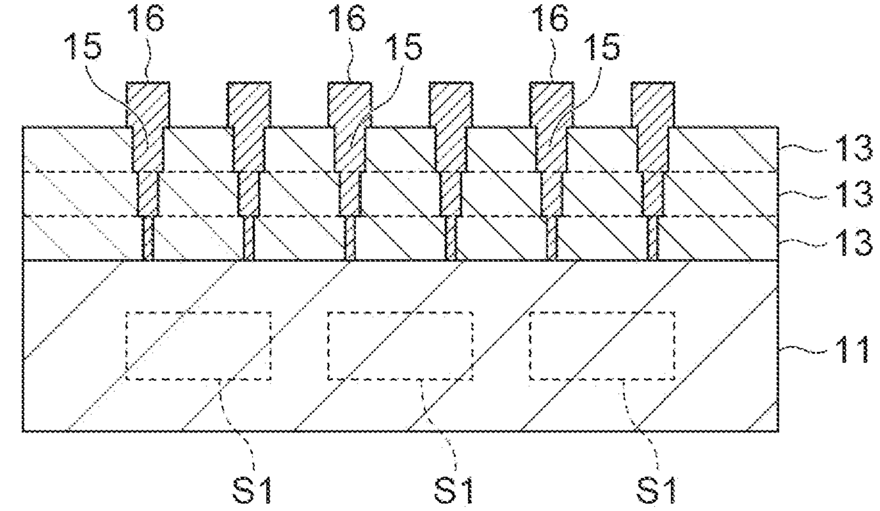
Figure 3C:
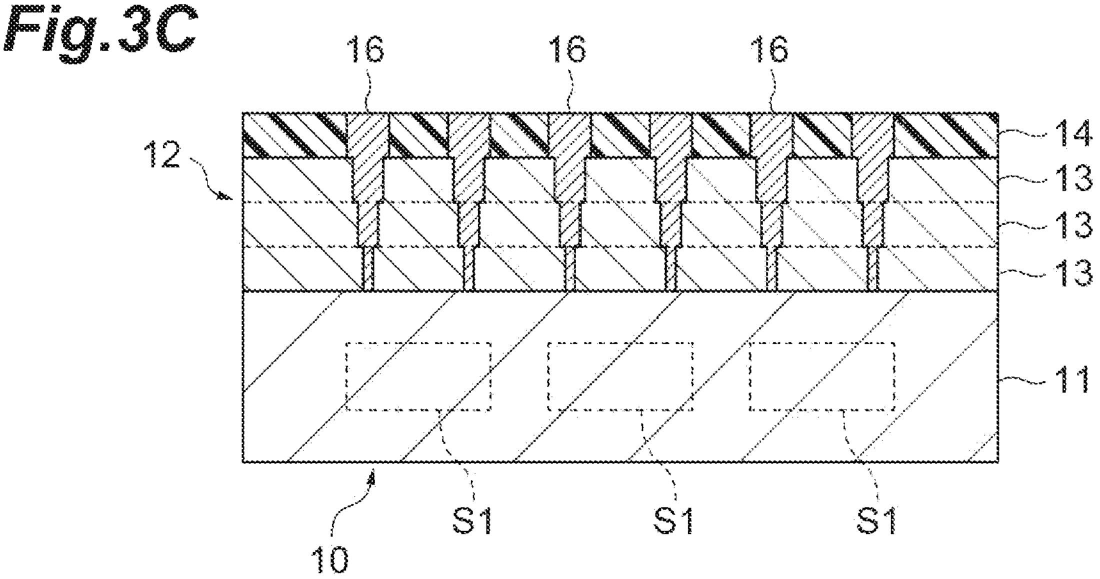
Figure 4:
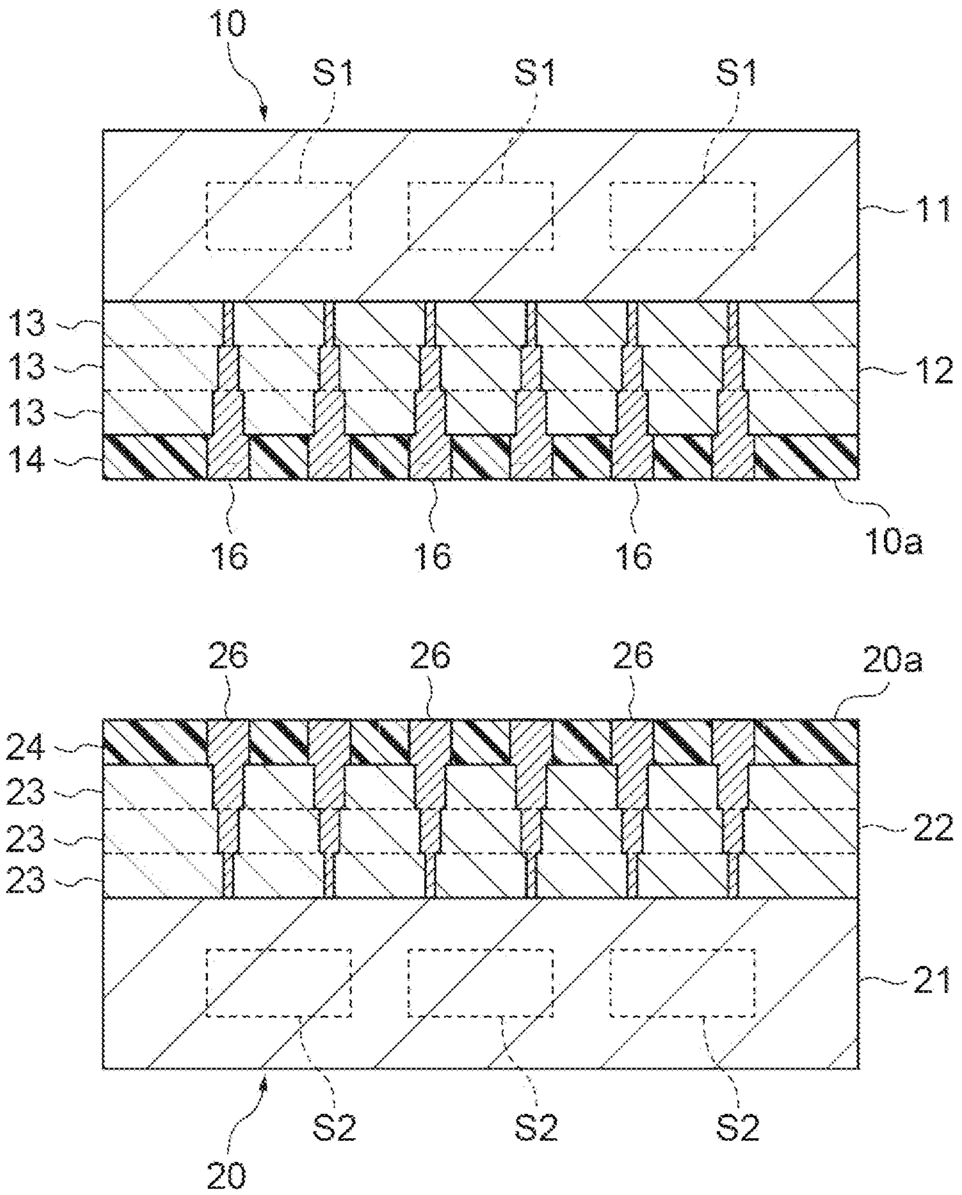
FIG. 4 is a cross-sectional view showing a method for manufacturing the semiconductor device shown in FIG. 1.

Next, a method for manufacturing the semiconductor device 1 will be described with reference to FIGS. 2A to 2C to FIG. 4. FIGS. 2A to 2C are cross-sectional views showing a part of a method for manufacturing the first integrated circuit element 10 used in manufacturing the semiconductor device 1. FIGS. 3A to 3C are cross-sectional views showing steps of the method for manufacturing the first integrated circuit element 10, which are performed subsequent to the steps in FIGS. 2A to 2C. The second integrated circuit element 20 can be manufactured by using a method similar to the method for manufacturing the first integrated circuit element 10 shown in FIGS. 2A to 2C and FIGS. 3A to 3C. FIG. 4 is a cross-sectional view showing a method for manufacturing the semiconductor device 1 from the first integrated circuit element 10 and the second integrated circuit element 20.

The semiconductor device 1 can be manufactured, for example, through the following steps (a) to (f).

(a) A step of preparing (providing) the first integrated circuit element 10 (see FIGS. 2A to 2C and FIGS. 3A to 3C).

(b) A step of preparing (providing) the second integrated circuit element 20 (see FIGS. 2A to 2C and FIGS. 3A to 3C).

Figure 5A:
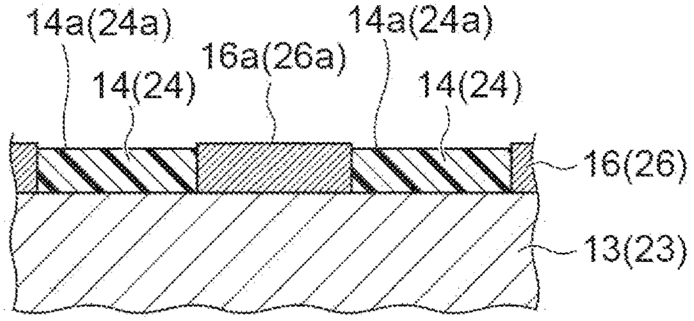
FIGS. 5A to 5D are cross-sectional views sequentially showing examples of bonding surfaces when bonding integrated circuit elements to each other.

(c) A step of polishing the bonding surface 10*a* of the first integrated circuit element 10 (see FIGS. 4 and 5A).

(d) A step of polishing the bonding surface 20*a* of the second integrated circuit element 20 (see FIGS. 4 and 5A).

Figure 5B:
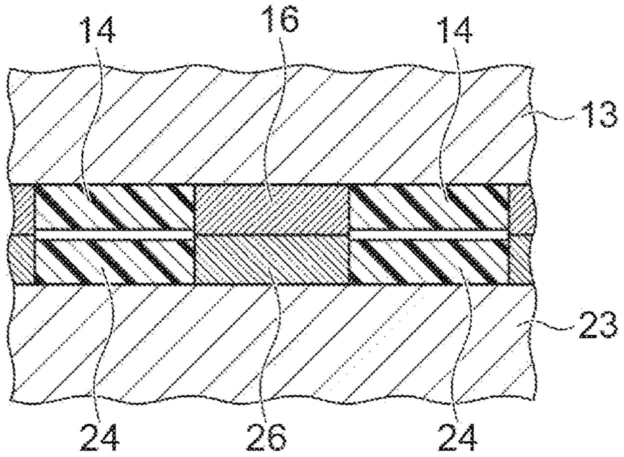
Figure 5C:
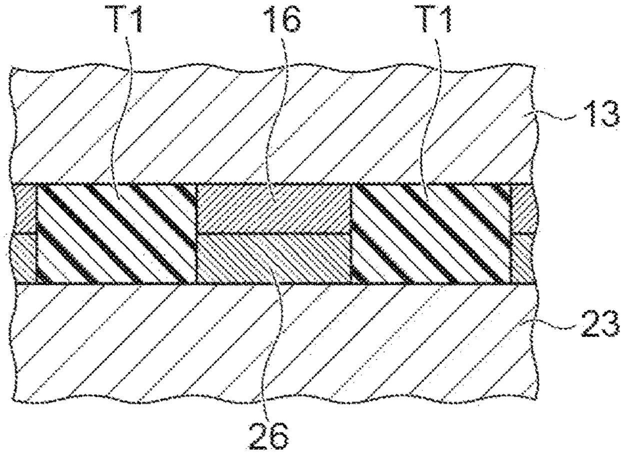

(e) A step of bonding the organic insulating layer 14 (first insulating film) of the first integrated circuit element 10 and the organic insulating layer 24 (second insulating film) of the second integrated circuit element 20 to each other (see FIGS. 4, 5B, and 5C).

Figure 5D:
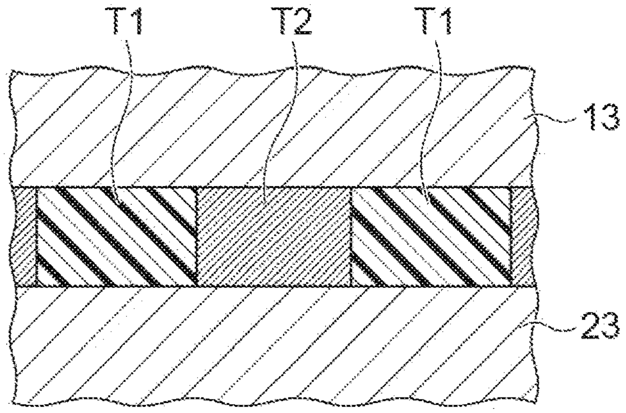

(f) A step of bonding the outer layer electrode 16 (first electrode) of the first integrated circuit element 10 and the outer layer electrode 26 (second electrode) of the second integrated circuit element 20 to each other (FIGS. 4, 5C, and 5D).

[Step (a)]

Step (a) is a step of preparing the first integrated circuit element 10 including the first semiconductor substrate 11 having a plurality of semiconductor elements S1 and the first wiring layer 12 provided on the second surface 11*b* of the first semiconductor substrate 11. In step (a), as shown in FIG. 2A, first, the inorganic insulating layer 13 is formed on the second surface 11*b* of the first semiconductor substrate 11 which is formed of silicon or the like and in which a functional circuit is formed. A plurality of semiconductor elements S1 are already formed on the first surface 11*a* of the first semiconductor substrate 11, inside thereof, and the like. The inorganic insulating layer 13 is formed of an inorganic material, such as silicon dioxide ($SiO_2$), and has a thickness of 0.01 μm or more and 10 μm or less. Then, as shown in FIGS. 2B and 2C, a plurality of grooves or holes 13*a* are provided in the inorganic insulating layer 13 by using, for example, a damascene method, and a metal such as copper is embedded in each groove or hole 13*a* by using a method, such as electroplating, sputtering, or a chemical vapor deposition (CVD) method. As a result, a plurality of inner layer electrodes 15 are formed. The width or diameter of the inner layer electrode 15 is, for example, 0.005 μm or more and 20 μm or less. The inorganic insulating layer 13 may be provided after the inner layer electrodes 15 are provided. Thereafter, a predetermined number of wiring layers each including the inorganic insulating layer 13 and the inner layer electrodes 15 are formed. As a result, as shown in FIG. 3A, a plurality of wiring layers (three layers as an example in the present embodiment) are formed.

Then, as shown in FIG. 3B, a plurality of outer layer electrodes 16 are formed as posts on the inorganic insulating layer 13, which is the outermost layer, so as to be electrically connected to the inner layer electrodes 15. Thereafter, as shown in FIG. 3C, an organic insulating material for forming the organic insulating layer 14 is applied onto the inorganic insulating layer 13, which is the outermost layer, and spread on the inorganic insulating layer 13 by, for example, spin coating, and cured. Then, processing such as polishing is performed so that the outer layer electrodes 16 are exposed. As a result, the organic insulating layer 14 is formed. The organic insulating layer 14 is formed as, for example, a single layer, but may have two or more layers. It is preferable that the thickness of the organic insulating layer 14 is smaller than the total thickness of the inorganic insulating layer/layers 13. For example, the thickness of the organic insulating layer 14 may be 1 μm or more and 10 μm or less, or may be 8 μm or less, preferably 5 μm or less. The organic insulating material used herein contains, for example, polyimide, a polyimide precursor (for example, polyamic ester or polyamic acid), polyamideimide, benzocyclobutene (BCB), polybenzoxazole (PBO), or a PBO precursor, and has a lower elastic modulus than inorganic materials such as silicon oxide ($SiO_2$). The elastic modulus of the organic insulating material forming the organic insulating layer 14 is, for example, 7.0 GPa or less, preferably 5.0 GPa or less or 3.0 GPa or less, more preferably 2.0 GPa or less or 1.5 GPa or less. The elastic modulus referred to herein means Young's modulus. The outer layer electrodes 16 are formed so as to pass through the organic insulating layer 14 by the above processes such as post formation, spin coating, and polishing. After forming the organic insulating layer 14, grooves or holes may be provided and the outer layer electrodes 16 may be formed therein.

[Step (b)]

Step (b) is a step of preparing (providing) the second integrated circuit element 20 including the second semiconductor substrate 21 having a plurality of semiconductor elements and the second wiring layer 22 provided on the second surface of the second semiconductor substrate 21. In step (b), as in step (a), the inorganic insulating layer 23 is formed on the second surface 21*b* of the second semiconductor substrate 21 formed of silicon or the like, a plurality of grooves or holes are provided in the inorganic insulating layer 23 by using, for example, a damascene method, and a metal such as copper is embedded in each groove or hole by using a method such as electroplating, sputtering, or a chemical vapor deposition (CVD) method. As a result, the inner layer electrodes 25 are formed. The inorganic insulating layer 23 may be provided after the inner layer electrodes 25 are provided. Thereafter, a predetermined number of wiring layers each including the inorganic insulating layer 23 and the inner layer electrodes 25 are formed. As a result, a plurality of wiring layers are formed.

Then, a plurality of outer layer electrodes 26 are formed as posts on the inorganic insulating layer 23 so as to be electrically connected to the inner layer electrodes 25. Thereafter, an organic insulating material for forming the organic insulating layer 24 is applied onto the inorganic insulating layer 23, which is the outermost layer, and spread on the inorganic insulating layer 23, which is the outermost layer, by, for example, spin coating and cured. Then, processing such as polishing is performed so that the outer layer electrodes 26 are exposed. As a result, the organic insulating layer 24 is formed. Similarly to the organic insulating layer 14, the organic insulating layer 24 is formed as, for example, a single layer, but may have two or more layers. It is preferable that the thickness of the organic insulating layer 24 is smaller than the total thickness of the inorganic insulating layer/layers 23. Similarly to the organic insulating layer 14, for example, the thickness of the organic insulating layer 24 may be 1 μm or more and 10 μm or less, or may be 8 μm or less, preferably 5 μm or less. As described above, the organic insulating material used herein contains, for example, polyimide, a polyimide precursor, polyamideimide, benzocyclobutene (BCB), polybenzoxazole (PBO), or a PBO precursor. The elastic modulus (Young's modulus) of the organic insulating material forming the organic insulating layer 24 is, for example, 7.0 GPa or less, preferably 5.0 GPa or less or 3.0 GPa or less, more preferably 2.0 GPa or less or 1.5 GPa or less. Similarly to the first integrated circuit element 10, the outer layer electrodes 26 are formed so as to pass through the organic insulating layer 24 by the above processes such as post formation, spin coating, and polishing. After forming the organic insulating layer 24, grooves may be provided to form the outer layer electrodes 26.

As the organic material forming the organic insulating layers 14 and 24, a photosensitive resin, a thermosetting non-conductive film (NCF), or a thermosetting resin may be used. This organic material may be an underfill material. The organic insulating material forming the organic insulating layers 14 and 24 may be a heat-resistant resin.

[Step (c)]

Step (c) is a step of polishing the bonding surface 10*a* of the first integrated circuit element 10. In step (c), by adjusting the polishing rates of the organic insulating layer 14 and the outer layer electrodes 16 formed of, for example, copper, the heights of these layers can be selectively adjusted. In step (c), as shown in FIGS. 4 and 5A, it is preferable to polish the bonding surface 10*a* of the first integrated circuit element 10 by using a chemical mechanical polishing (CMP) method so that a surface 14*a* of the organic insulating layer 14 is located at the same position as a surface 16*a* of each outer layer electrode 16 or a slightly lower (recessed) position than the surface 16*a* of each outer layer electrode 16. This is because the organic insulating layer generally has a larger thermal expansion than the electrode, that is, a metal material, and accordingly, the organic insulating material expands due to heating in the subsequent bonding step to close the gap and obtain a good bonding state. In step (c), the polishing using the CMP method may also be performed so that the surface 16*a* of each outer layer electrode 16 matches the surface 14*a* of the organic insulating layer 14. During this polishing, it is preferable to polish the surface of the organic insulating layer 14 so that the surface roughness Ra thereof is 2 nm or less. The surface roughness Ra used herein is the arithmetic mean roughness (Ra) specified in JIS B 0601-2001. The same applies to the following.

[Step (d)]

Step (d) is a step of polishing the bonding surface 20*a* of the second integrated circuit element 20. In step (d), as in step (c), by adjusting the polishing rates of the organic insulating layer 24 and the outer layer electrodes 26 formed of, for example, copper, the heights of these layers can be selectively adjusted. In step (d), as in step (c), as shown in FIGS. 4 and 5A, it is preferable to polish the bonding surface 20*a* of the second integrated circuit element 20 by using a CMP method so that a surface 24*a* of the organic insulating layer 24 is located at the same position as a surface 26*a* of each outer layer electrode 26 or a slightly lower (recessed) position than the surface 26*a* of each outer layer electrode 26. In step (d), the polishing using the CMP method may also be performed so that the surface 26*a* of each outer layer electrode 26 matches the surface 24*a* of the organic insulating layer 24. During this polishing, it is preferable to polish the surface of the organic insulating layer 24 so that the surface roughness Ra thereof is 2 nm or less.

In steps (c) and (d), the polishing may be performed so that the thickness of the organic insulating layer 14 and the thickness of the organic insulating layer 24 are the same. However, for example, the polishing may be performed so that the thickness of the organic insulating layer 14 is larger than the thickness of the organic insulating layer 24. Conversely, the polishing may be performed so that the thickness of the organic insulating layer 24 is larger than the thickness of the organic insulating layer 14. Thus, by making one organic insulating layer have a larger thickness, a larger amount of foreign matter can adhere to the thickened organic insulating layer, and by making the other organic insulating layer have a smaller thickness, the overall thickness of the semiconductor device 1 can be reduced.

[Step (e)]

Step (e) is a step of bonding the organic insulating layer 14 of the first integrated circuit element 10 and the organic insulating layer 24 of the second integrated circuit element 20 to each other. In step (e), organic matter or metal oxide adhering to the bonding surface 10*a* of the first integrated circuit element 10 and the bonding surface 20*a* of the second integrated circuit element 20 is removed. Then, as shown in FIG. 4, the bonding surface 10*a* of the first integrated circuit element 10 is made to face the bonding surface 20*a* of the second integrated circuit element 20, and alignment between each outer layer electrode 16 of the first integrated circuit element 10 and each outer layer electrode 26 of the second integrated circuit element 20 is performed (see FIG. 5B). At this alignment stage, the organic insulating layer 14 of the first integrated circuit element 10 and the organic insulating layer 24 of the second integrated circuit element 20 are spaced apart from each other and are not bonded to each other (however, the organic insulating layers 14 and 24 are aligned). After the end of the alignment, the organic insulating layer 14 of the first integrated circuit element 10 and the organic insulating layer 24 of the second integrated circuit element 20 are bonded to each other (see FIG. 5C). At this time, the organic insulating layer 14 of the first integrated circuit element 10 and the organic insulating layer 24 of the second integrated circuit element 20 may be uniformly heated and then bonded to each other. The heating temperature when bonding the organic insulating layers 14 and 24 to each other may be, for example, 30° ° C. or higher and 400° C. or lower, and the pressure may be 0.1 MPa or higher and 1 MPa or lower. It is preferable that the temperature difference between the organic insulating layer 14 and the organic insulating layer 24 during bonding is, for example, 10° C. or lower. By such heating and bonding at a uniform temperature, the organic insulating layer 14 and the organic insulating layer 24 are bonded to each other to form an insulating bonding portion T1, so that the first integrated circuit element 10 and the second integrated circuit element 20 are mechanically strongly attached to each other. Due to heating and bonding at a uniform temperature, it is difficult for misalignment or the like to occur at the bonding portion. Therefore, it is possible to perform high-accuracy bonding.

[Step (f)]

Step (f) is a step of bonding the outer layer electrodes 16 of the first integrated circuit element 10 and the outer layer electrodes 26 of the second integrated circuit element 20 to each other. In step (f), after the end of the bonding between the organic insulating layers in step (e) as shown in FIG. 5C, predetermined heat or pressure or both are applied to bond the outer layer electrodes 16 of the first integrated circuit element 10 and the outer layer electrodes 26 of the second integrated circuit element 20 to each other (see FIG. 5D). When the outer layer electrodes 16 and 26 are formed of copper, the heating temperature in step (f) is 150° C. or higher and 400° C. or lower or may be 200° C. or higher and 300° C. or lower, and the pressure may be 0.1 MPa or higher and 1 MPa or lower. By such a bonding process, each outer layer electrode 16 and each outer layer electrode 26 corresponding to the outer layer electrode 16 are bonded to each other to form an electrode bonding portion T2, so that the outer layer electrodes 16 and the outer layer electrodes 26 are mechanically and electrically strongly bonded to each other. The electrode bonding in step (f) is performed after the bonding in step (e), but may be performed simultaneously with the bonding in step (e).

After the end of the bonding between the first integrated circuit element 10 and the second integrated circuit element 20 in step (f), the semiconductor device 1 can be obtained. Individual semiconductor devices can be obtained by singulating the semiconductor device 1 with a cutting means such as dicing. As a method for singulating the semiconductor device 1, for example, plasma dicing, stealth dicing, or laser dicing can be used.

As described above, according to the method for manufacturing a semiconductor device according to the present embodiment, the organic insulating layer 14 is arranged on the bonding surface 10*a* side of the first integrated circuit element 10, and the inorganic insulating layer 13 is provided inside the first integrated circuit element 10. In this case, an organic insulating material, for which it is easy to perform processing such as flattening and which is soft, is provided on the bonding surface 10*a* side, while an inorganic insulating material, with which fine wiring can be formed and which is excellent in heat resistance reliability, is provided inside the first integrated circuit element 10. Therefore, it is possible to more easily and reliably bond integrated circuit elements having fine wiring to each other. In addition, when the organic insulating material is used, pressure bonding by heating is easy. Therefore, the accuracy of the flatness of the surface of the electrode and the surface of the insulating film, which serve as bonding surfaces, can be relaxed. Further, according to this manufacturing method, since the organic insulating layer 14 needs to be used only on the bonding surface 10*a* of the first integrated circuit element 10, the amount of the organic insulating layer 14 used can be reduced. Therefore, it is possible to suppress the occurrence of outgassing in a vacuum process or a heating process.

In the method for manufacturing a semiconductor device according to the present embodiment, the second wiring layer 22 has the inorganic insulating layer 23 containing an inorganic insulating material and the organic insulating layer 24 containing an organic insulating material, and the organic insulating layer 24 is located on the bonding surface 20*a* side of the second integrated circuit element 20 opposite to the second semiconductor substrate 21. In this case, in the second integrated circuit element 20 as well, an organic insulating material, for which it is easy to perform processing such as flattening and which is soft, is provided on the bonding surface 20*a* side, while an inorganic insulating material, with which fine wiring can be formed and which is excellent in heat resistance reliability, is provided inside the second integrated circuit element 20. Therefore, it is possible to more easily and reliably bond integrated circuit elements having fine wiring to each other. In addition, in the second integrated circuit element 20 as well, when the organic insulating material is used, pressure bonding by heating is easier. Therefore, the accuracy of the flatness of the surface of the electrode and the surface of the insulating film, which serve as bonding surfaces, can be further relaxed. Further, according to this manufacturing method, since the organic insulating layer 24 needs to be used only on the bonding surface 20*a* of the second integrated circuit element 20, the amount of the organic insulating layer 24 used can be reduced. Therefore, it is possible to further suppress the occurrence of outgassing in a vacuum process or a heating process.

In the method for manufacturing a semiconductor device according to the present embodiment, the thickness of the organic insulating layer 14 of the first wiring layer 12 is smaller than the total thickness of the inorganic insulating layers 13. The thickness of the organic insulating layer 24 of the second wiring layer 22 is also smaller than the total thickness of the inorganic insulating layers 23. In this case, it is possible to increase the amount of the inorganic insulating layers 13 and 23 having excellent connection reliability while using a small amount of organic insulating layers 14 and 24 having excellent workability on the bonding surfaces 10*a* and 20*a*. Therefore, it is possible to more easily and reliably bond the integrated circuit elements to each other.

In the method for manufacturing a semiconductor device according to the present embodiment, the Young's modulus of the organic insulating material contained in the organic insulating layer 14 and the organic insulating layer 24 is 7.0 GPa or less. Therefore, even if foreign matter enters between the integrated circuit elements, the foreign matter can be embedded in one of the organic insulating layers. As a result, it is possible to prevent bonding between the insulating films from being adversely affected by the foreign matter. The Young's modulus of the organic insulating material contained in the organic insulating layer 14 and the organic insulating layer 24 is preferably 3.0 GPa or less. In this case, since the foreign matter entering between the integrated circuit elements can be more reliably embedded in the organic insulating layer, it is possible to more reliably bond the integrated circuit elements to each other.

In the method for manufacturing a semiconductor device according to the present embodiment, the organic insulating material contained in the organic insulating layer 14 and the organic insulating layer 24 contains polyimide, a polyimide precursor, polyamideimide, benzocyclobutene (BCB), polybenzoxazole (PBO), or a PBO precursor. In this case, it is possible to further improve the connection reliability at a bonding portion using the organic insulating material.

In the method for manufacturing a semiconductor device according to the present embodiment, the inorganic insulating layers 13 of the first wiring layer 12 are formed as a plurality of layers, and the organic insulating layer 14 is formed as a single layer. The inorganic insulating layers 23 of the second wiring layer 22 are formed as a plurality of layers, and the organic insulating layer 24 is formed as a single layer. In this case, it is possible to increase the amount of the inorganic insulating layers 13 and 23 having excellent connection reliability while using a small amount of organic insulating layers 14 and 24 having excellent workability. Therefore, it is possible to more easily and reliably bond the integrated circuit elements to each other.

In the method for manufacturing a semiconductor device according to the present embodiment, the thicknesses of the organic insulating layer 14 and the organic insulating layer 24 may be 10 μm or less. In this case, since the amount of the organic insulating layer used can be reduced, it is possible to suppress the occurrence of outgassing in a vacuum process or a heating process.

The method for manufacturing a semiconductor device according to the present embodiment, further includes a step of polishing the organic insulating layer 14 and the outer layer electrodes 16 of the first integrated circuit element 10, and a step of polishing the organic insulating layer 24 and the outer layer electrodes 26 of the second integrated circuit element 20. In these polishing steps, each of the first integrated circuit element 10 and the second integrated circuit element 20 are polished by using a CMP method so that the surfaces 14*a* and 24*a* of the organic insulating layers 14 and 24 are recessed from the surfaces 16*a* and 26*a* of the outer layer electrodes 16 and 26. In this case, the first integrated circuit element 10 and the second integrated circuit element 20 can be more reliably bonded to each other. In addition, in this manufacturing method, in the step of polishing the first integrated circuit element 10, the polishing is performed so that the surface roughness Ra of the surface of the organic insulating layer 14 is 2 nm or less. In the step of polishing the second integrated circuit element 20, the polishing is performed so that the surface roughness Ra of the surface of the organic insulating layer 24 is 2 nm or less. In this case, the first integrated circuit element 10 and the second integrated circuit element 20 can be more strongly bonded to each other.

While the embodiment of the present invention has been described above in detail, the present invention is not limited to the above embodiment. For example, in the above embodiment, in steps (c) and (d), the organic insulating layer 14 and the outer layer electrodes 16 of the first integrated circuit element 10 and the organic insulating layer 24 and the outer layer electrodes 26 of the second integrated circuit element 20 are polished by using a CMP method or the like. However, if the organic insulating layers 14 and 24 can absorb foreign matter or the like, the polishing by the CMP method may be omitted, or the polishing can be changed to simpler one. Although the case of applying the present invention to hybrid bonding in Wafer to Wafer (W2W) is illustrated in the above embodiment, the present invention may be applied to Chip to Chip (C2C) or Chip to Wafer (C2W).

REFERENCE SIGNS LIST

1: semiconductor device, 10: first integrated circuit element, 10*a*: bonding surface (first bonding surface), 11: first semiconductor substrate, 11*a*: first surface, 11*b*: second surface, 12: first wiring layer, 13: inorganic insulating layer (first insulating film, first inorganic insulating layer), 14: organic insulating layer (first insulating film, first organic insulating layer), 14*a*: surface, 15: inner layer electrode (first electrode), 16: outer layer electrode (first electrode), 16*a*: surface, 20: second integrated circuit element, 20*a*: bonding surface (second bonding surface), 21: second semiconductor substrate, 22: second wiring layer, 23: inorganic insulating layer (second insulating film, second inorganic insulating layer), 24: organic insulating layer (second insulating film, second organic insulating layer), 24*a*: surface, 25: inner layer electrode (second electrode), 26: outer layer electrode (second electrode), 26*a*: surface, S1, S2: semiconductor element, T1: insulating bonding portion, T2: electrode bonding portion.

The invention claimed is:

1. A method for manufacturing a semiconductor device, comprising:

providing a first integrated circuit element including a first semiconductor substrate having a semiconductor element and a first wiring layer having a first insulating film and a first electrode, the first wiring layer being provided on a surface of the first semiconductor substrate;

providing a second integrated circuit element including a second semiconductor substrate having a semiconductor element and a second wiring layer having a second insulating film and a second electrode, the second wiring layer being provided on a surface of the second semiconductor substrate;

bonding the first insulating film of the first integrated circuit element and the second insulating film of the second integrated circuit element to each other; and bonding the first electrode of the first integrated circuit element and the second electrode of the second integrated circuit element to each other, wherein the first insulating film includes a first inorganic insulating layer containing an inorganic insulating material and a first organic insulating layer containing an organic insulating material, and the first organic insulating layer is located on a first bonding surface side of the first integrated circuit element opposite to the first semiconductor substrate, wherein the second insulating film includes a second inorganic insulating layer containing an inorganic insulating material and a second organic insulating layer containing an organic insulating material, and the second organic insulating layer is located on a second bonding surface side of the second integrated circuit element opposite to the second semiconductor substrate, wherein a thickness of the first organic insulating layer is smaller than a thickness of the first inorganic insulating layer, and a thickness of the second organic insulating layer is smaller than a thickness of the second inorganic insulating layer, and wherein, in the bonding the first insulating film and the second insulating film to each other, the first integrated circuit element and the second integrated circuit element are caused to face each other in a state where a surface of the first organic insulating layer is recessed from the first electrode and a surface of the second organic insulating layer is recessed from the second electrode, and are heated to be bonded.

2. The method for manufacturing a semiconductor device according to claim 1, wherein the organic insulating material contained in at least one of the first organic insulating layer and the second organic insulating layer has a Young's modulus of 7.0 GPa or less.

3. The method for manufacturing a semiconductor device according to claim 2, wherein the organic insulating material contained in at least one of the first organic insulating layer and the second organic insulating layer has a Young's modulus of 3.0 GPa or less.

4. The method for manufacturing a semiconductor device according to claim 1, wherein the organic insulating material contained in at least one of the first organic insulating layer and the second organic insulating layer contains polyimide, a polyimide precursor, polyamideimide, benzocyclobutene (BCB), polybenzoxazole (PBO), or a PBO precursor.

5. The method for manufacturing a semiconductor device according to claim 1, wherein the first inorganic insulating layer is formed as a plurality of layers, the first organic insulating layer is formed as a single layer, the second inorganic insulating layer is formed as a plurality of layers, and the second organic insulating layer is formed as a single layer.

6. The method for manufacturing a semiconductor device according to claim 1, wherein at least one of the first organic insulating layer and the second organic insulating layer has a thickness of 10 μm or less.

7. The method for manufacturing a semiconductor device according to claim 1, further comprising:

polishing the first organic insulating layer and the first electrode of the first integrated circuit element; and polishing the second organic insulating layer and the second electrode of the second integrated circuit element.

8. The method for manufacturing a semiconductor device according to claim 7, wherein, in the polishing of the first integrated circuit element, the first organic insulating layer and the first electrode are polished by using a chemical mechanical polishing method so that the surface of the first organic insulating layer is recessed from the first electrode, and wherein, in the polishing of the second integrated circuit element, the second organic insulating layer and the second electrode are polished by using a chemical mechanical polishing method so that the surface of the second organic insulating layer is recessed from the second electrode.

9. The method for manufacturing a semiconductor device according to claim 7, wherein, in the polishing of the first integrated circuit element, polishing is performed so that a surface roughness of the surface of the first organic insulating layer is 2 nm or less, and wherein, in the polishing of the second integrated circuit element, polishing is performed so that a surface roughness of the surface of the second organic insulating layer is 2 nm or less.

10. An integrated circuit element to be bonded to another integrated circuit element to manufacture a semiconductor device, comprising:

a semiconductor substrate having a first surface and a second surface, a semiconductor element being formed at least on the first surface or inside the semiconductor substrate; and a wiring layer provided on the second surface of the semiconductor substrate, wherein the wiring layer includes:

an inorganic insulating layer provided on the second surface of the semiconductor substrate;

an organic insulating layer provided on the inorganic insulating layer and exposed to outside of the wiring layer; and an electrode electrically connected to the semiconductor element of the semiconductor substrate and passing through the inorganic insulating layer and the organic insulating layer to be exposed to outside from the organic insulating layer, wherein a thickness of the organic insulating layer is smaller than a thickness of the inorganic insulating layer, and an organic insulating material contained in the organic insulating layer has a Young's modulus of 7.0 GPa or less, and wherein a surface of the organic insulating layer is recessed from the electrode.

11. A method for manufacturing the integrated circuit element according to claim 10, comprising:

providing a semiconductor substrate having a first surface and a second surface, a semiconductor element being formed at least on the first surface or inside the semiconductor substrate; and forming a wiring layer on the second surface of the semiconductor substrate, wherein the forming of the wiring layer includes:

forming an inorganic insulating layer on the second surface of the semiconductor substrate;

forming an inner layer electrode passing through the inorganic insulating layer so as to be electrically connected to the semiconductor element;

forming an organic insulating layer on the inorganic insulating layer; and forming an outer layer electrode passing through the organic insulating layer so as to be electrically connected to the inner layer electrode, wherein a thickness of the organic insulating layer is smaller than a thickness of the inorganic insulating layer, wherein an organic insulating material contained in the organic insulating layer has a Young's modulus of 7.0 GPa or less, and wherein the forming of the wiring layer further includes:

polishing the organic insulating layer and the outer layer electrode, wherein the organic insulating layer and the outer layer electrode are polished by using a chemical mechanical polishing method so that the surface of the organic insulating layer is recessed from the outer layer electrode.

12. The method for manufacturing an integrated circuit element according to claim 11, wherein the organic insulating layer is formed after forming the outer layer electrode.

13. The method for manufacturing a semiconductor device according to claim 1, wherein a thickness of the first organic insulating layer is 1 μm or more.

14. The method for manufacturing a semiconductor device according to claim 1, wherein the first inorganic insulating layer includes three or more layers.

15. The method for manufacturing a semiconductor device according to claim 5, wherein a first portion of the first electrode provided in the first inorganic insulating layer has a smaller diameter or width than a second portion of the first electrode provided in the first organic insulating layer, and wherein a third portion of the second electrode provided in the second inorganic insulating layer has a smaller diameter or width than a fourth portion of the second electrode provided in the second organic insulating layer.

16. The integrated circuit element according to claim 10, wherein a thickness of the organic insulating layer is 1 μm or more.

17. The integrated circuit element according to claim 10, wherein the inorganic insulating layer includes three or more layers.

18. The integrated circuit element according to claim 10, wherein the inorganic insulating layer is formed as a plurality of layers, and the organic insulating layer is formed as a single layer, wherein a first portion of the electrode provided in the inorganic insulating layer has a smaller diameter or width than a second portion of the electrode provided in the organic insulating layer.

* * * * *